United States Patent
Ohnuki (10) Patent No.: US 8,921,707 B2
(45) Date of Patent: Dec. 30, 2014

(54) SUSPENSION SUBSTRATE, SUSPENSION, HEAD SUSPENSION, AND HARD DISK DRIVE

(75) Inventor: Masao Ohnuki, Shinjuku-Ku (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 415 days.

(21) Appl. No.: 13/176,231

(22) Filed: Jul. 5, 2011

(65) Prior Publication Data

US 2012/0006586 A1  Jan. 12, 2012

(30) Foreign Application Priority Data

Jul. 6, 2010  (JP) .................................. 2010-154135

(51) Int. Cl.
*H05K 1/11* (2006.01)
*H05K 3/32* (2006.01)
*H05K 1/05* (2006.01)

(52) U.S. Cl.
CPC .................. *H05K 1/05* (2013.01); *H05K 3/321* (2013.01); *H05K 2201/0397* (2013.01); *H05K 2201/10083* (2013.01)
USPC ........... 174/261; 174/257; 174/262; 361/760; 360/245.9

(58) Field of Classification Search
CPC ....... H05K 1/05; H05K 3/321; H05K 3/0061; H05K 3/4053; H05K 2201/10083; H05K 2201/0367; G11B 5/4833; G11B 5/486
USPC .................. 174/254, 257, 260–262; 361/760; 360/241, 244.5, 244.7, 245, 245.4, 360/245.8, 245.9
See application file for complete search history.

(56) References Cited

U.S. PATENT DOCUMENTS

| | | | |
|---|---|---|---|
| 6,841,737 B2 * | 1/2005 | Komatsubara et al. ....... | 174/250 |
| 7,388,733 B2 * | 6/2008 | Swanson et al. ........... | 360/245.9 |
| 7,903,376 B2 * | 3/2011 | Chang et al. ............... | 360/245.9 |
| 8,218,267 B2 * | 7/2012 | Arai et al. .................. | 360/245.9 |
| 2004/0070884 A1 * | 4/2004 | Someya et al. ............ | 360/245.9 |
| 2004/0264056 A1 * | 12/2004 | Jang et al. .................. | 360/245.9 |
| 2005/0280944 A1 * | 12/2005 | Yang et al. .................. | 360/245.9 |
| 2010/0067151 A1 | 3/2010 | Okawara et al. | |
| 2010/0165515 A1 * | 7/2010 | Ando ........................... | 360/290 |

FOREIGN PATENT DOCUMENTS

JP    2010-086649 A1    4/2010

* cited by examiner

*Primary Examiner* — Hoa C Nguyen
(74) *Attorney, Agent, or Firm* — Burr & Brown, PLLC (57) ABSTRACT

A suspension substrate according to the present invention includes an insulating layer and a metallic support layer provided on the actuator element's side of the insulating layer. On the other side of the insulating layer, a wiring layer is provided. This wiring layer includes a plurality of wirings and a wiring connection section that can be electrically connected with the actuator element via a conductive adhesive. The outer periphery of the metallic support layer in a connection structure region is positioned outside relative to the outer periphery of the insulating layer and the outer periphery of the wiring connection section of the wiring layer.

13 Claims, 10 Drawing Sheets

SUSPENSION SUBSTRATE, SUSPENSION, HEAD SUSPENSION, AND HARD DISK DRIVE

CROSS REFERENCE TO RELATED APPLICATIONS

This application is based on the prior Japanese Patent Application No. 2010-154135 filed on Jul. 6, 2010, the entire contents of which are incorporated herein by reference.

FIELD OF THE INVENTION

The present invention relates to a suspension substrate, a suspension, a head suspension and a hard disk drive. In particular, this invention relates to the suspension substrate, suspension, head suspension and hard disk drive, respectively adapted for preventing a short circuit between electrodes of each actuator element connected with the suspension substrate via a conductive adhesive.

BACKGROUND ART

Generally, the hard disk drive (HDD) includes the suspension substrate on which a magnetic head slider mounted. In this case, the magnetic head slider is provided for writing and reading data relative to a disk adapted for storing therein the data. The suspension substrate includes a metallic support layer and a wiring layer layered on the metallic support layer, via an insulating layer. The wiring layer has a plurality of wirings. With this configuration, by flowing or sending an electric signal through each wiring, the writing and reading of the data relative to the disk can be performed.

In the hard disk drive of this type, an actuator arm for supporting the magnetic head slider and a VCM actuator (e.g., a voice coil motor) are provided respectively. In this case, in order to move the magnetic head slider to a desired data track on the disk, the actuator arm is pivoted by the VCM actuator, under control of a servo-control system.

In recent years, for an attempt to provide a more high-density disk, the width of each data track has been narrowed. However, in some cases, such an attempt makes it rather difficult to accurately align the magnetic head slider with the desired track, by using the VCM actuator.

To address this problem, the suspension of the so-called dual actuator type has been reported. In this case, the VCM actuator is cooperated with a PZT micro-actuator (or DSA (Dual Stage Actuator)), in order to move the magnetic head slider to the desired track (e.g., see JP2010-86649A). Specifically, the PZT micro-actuator is composed of a piezoelectric element composed of a lead titanate zirconate (PZT) and configured to be expanded and contracted with application of a voltage, thus enabling the magnetic head slider to be finely moved. Namely, in the suspension of the dual actuator type, the VCM actuator serves to roughly control the position of the magnetic head slider, while the PZT micro-actuator serves to finely control the position of the magnetic head slider. In this way, the magnetic head slider can be aligned, rapidly and accurately, with the desired track.

For instance, in the suspension substrate disclosed in the above JP2010-86649A, a through hole for exposing a wiring section is provided in an electric insulating layer in a terminal part for supplying electricity to the piezoelectric element, and a ring-like liquid stopper is provided on the piezoelectric element's side of the electric insulating layer. With this configuration, by injecting a liquid conductive adhesive into the through hole, the piezoelectric element can be joined to the terminal part, as well as the electrode of the piezoelectric element located on the side of the suspension substrate can be electrically connected with the wiring section. Meanwhile, the electrode of the piezoelectric element located on the side opposite to the suspension substrate is electrically connected with a base plate.

SUMMARY OF THE INVENTION

However, there is a small gap provided between the piezoelectric element and the liquid stopper. Therefore, depending on the amount of the injected conductive adhesive, a large amount of the conductive adhesive may be overflowed outward from the liquid stopper. In this case, if the terminal part is located in the vicinity of a load beam welded to the base plate, the conductive adhesive overflowed from the liquid stopper may reach the load beam, resulting in the short circuit between the electrodes of the piezoelectric element.

The present invention was made in light of the above problem. Therefore, it is an object of this invention to provide the suspension substrate, suspension, head suspension and hard disk drive, respectively capable of preventing the short circuit between the electrodes of each actuator element connected with the suspension substrate via the conductive adhesive.

In one aspect for achieving the above object, the present invention provides the suspension substrate including a substrate main body region, a connection structure region that can be connected with one actuator element via the conductive adhesive, and an extension structure region extending between the substrate main body region and the connection structure region, wherein this suspension substrate further includes: the insulating layer; the metallic support layer provided on the actuator element's side of the insulating layer; and the wiring layer provided on the other side of the insulating layer, the wiring layer including the plurality of wirings and a wiring connection section that can be electrically connected with the actuator element, via the conductive adhesive, and wherein the outer periphery of the metallic support layer in the connection structure region is positioned outside relative to the outer periphery of the insulating layer and the outer periphery of the wiring connection section of the wiring layer.

The suspension substrate of this invention may further include a protective layer for covering the wiring layer, wherein the outer periphery of the protective layer in the connection structure region is positioned inside relative to the outer periphery of the metallic support layer.

In the suspension substrate of this invention, a through hole for exposing the wiring connection section of the wiring layer may be provided to extend through the protective layer in the connection structure region, wherein a gold plating is provided to the exposed portion of the wiring connection section in the through hole.

Further, in the suspension substrate of this invention, the insulating layer in the extension structure region may include a first insulating layer end portion located on the side of the connection structure region, and a second insulating layer end portion located on the side of the substrate main body region and having a width greater than the width of the first insulating layer end portion.

Further, in the suspension substrate of this invention, the insulating layer in the extension structure region may have a width gradually increased from the first insulating layer end portion toward the second insulating layer end portion.

The suspension substrate of this invention may further include the protective layer for covering the wiring layer, wherein the protective layer in the extension structure region includes a first protective layer end portion located on the side of the connection structure region, and a second protective layer end portion located on the side of the substrate main body region and having a width greater than the width of the first protective layer end portion.

In the suspension substrate of this invention, the insulating layer in the extension structure region may have the width gradually increased from the first insulating layer end portion toward the second insulating layer end portion, wherein the protective layer in the extension structure region has a width gradually increased from the first protective layer end portion toward the second protective layer end portion.

In the suspension substrate of this invention, the outer periphery of the protective layer in the connection structure region may be positioned inside relative to the outer periphery of the metallic support layer.

Further, in the suspension substrate of this invention, a through hole for exposing the wiring connection section of the wiring layer may be provided to extend through the protective layer, in the connection structure region, wherein a gold plating is provided to the exposed portion of the wiring connection section in the through hole.

In another aspect, the present invention provides the suspension including: the base plate; the suspension substrate of this invention attached to the base plate via the load beam; and the actuator element joined to at least one of the base plate and load beam, the actuator element being connected with the connection structure region of the suspension substrate, via the conductive adhesive.

Further, the present invention provides the head suspension including: the suspension of this invention; and a slider mounted on the suspension.

Further, the present invention provides the hard disk drive including the head suspension of this invention.

Therefore, according to the present invention, the outer periphery of the metallic support layer can be visually confirmed when the actuator element is connected with the connection structure region of the suspension substrate via the conductive adhesive. This visual confirmation ability relative to the outer periphery of the metallic support layer can effectively prevent the conductive adhesive from being unduly overflowed from the metallic support layer and thus reaching any other metallic structure located around the connection structure region. Therefore, the short circuit between the electrodes of the actuator element can be securely prevented.

DETAILED DESCRIPTION OF THE INVENTION

First Embodiment

Now referring to FIGS. 1 through 10, the suspension substrate, suspension, head suspension and hard disk drive, respectively related to the first embodiment of the present invention, will be described.

Figure 1:
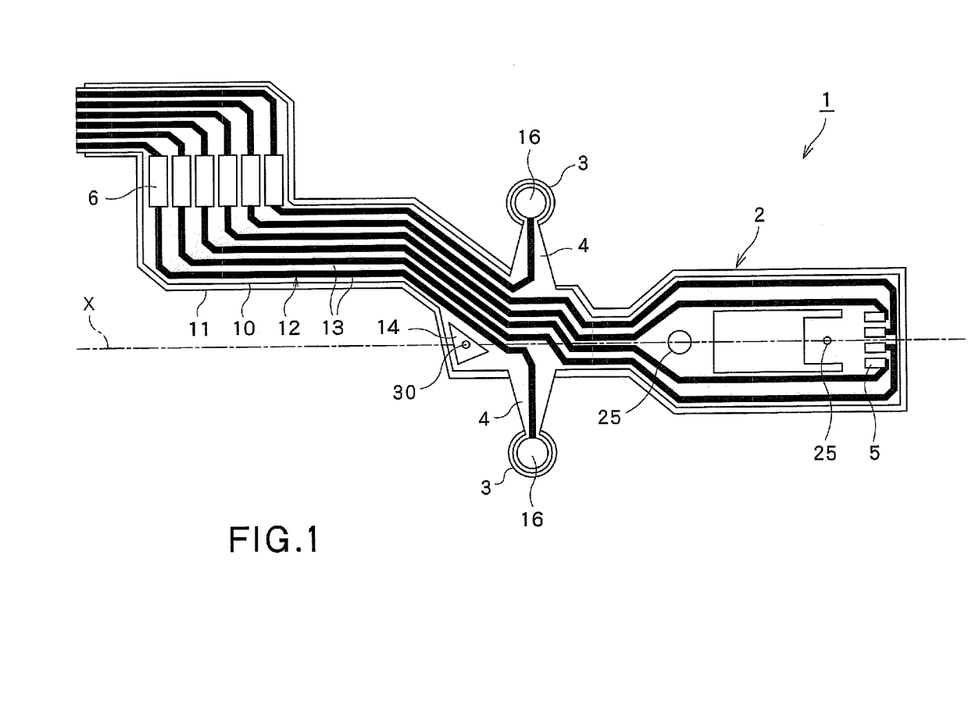
FIG. 1 is a plan view showing one example of the suspension substrate related to a first embodiment of the present invention.
Figure 8:
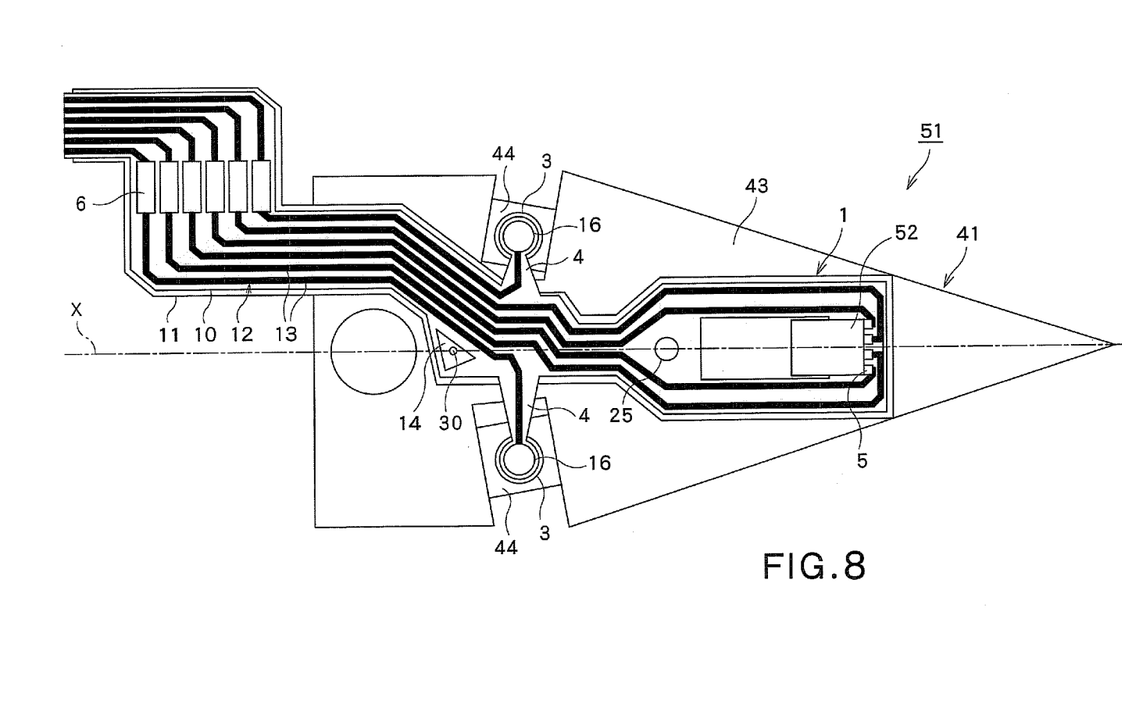
FIG. 8 is a plan view showing one example of the head suspension related to the first embodiment of the present invention.

As shown in FIG. 1, the suspension substrate 1 includes the substrate main body region 2, a pair of connection structure regions 3, respectively connectable with the piezoelectric elements 44 (i.e., the actuator elements, respectively shown in FIG. 4) that will be respectively located on both sides of the substrate main body region 2, and a pair of extension structure regions 4, respectively extending between the substrate main body region 2 and each connection structure region 3. It is noted that the piezoelectric elements 44 will be described later. In the substrate main body region 2, a head terminal 5 provided to be connected with a slider 52 (as is shown in FIG. 8 and will be described later), and an external equipment connection terminal 6 adapted to be connected with external equipment (not shown) are provided, respectively. Further, the wirings 13 that will be described later are respectively provided to connect between the head terminal 5 and the external equipment connection terminal 6.

Figure 2:
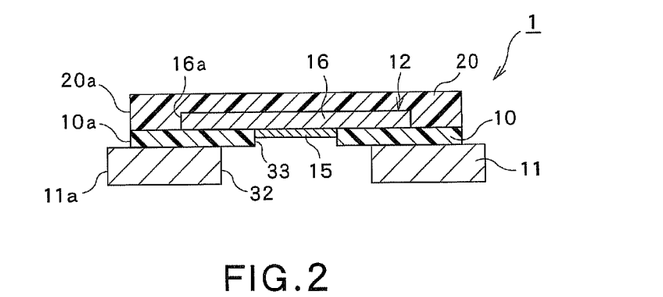
FIG. 2 is a cross section provided for illustrating the connection structure region in the suspension substrate related to the first embodiment of the present invention.

As shown in FIGS. 1 and 2, the suspension substrate 1 includes the insulating layer 10, the metallic layer 11 provided on the piezoelectric element's side of the insulating layer 10, and the wiring layer 12 provided on the other side of the insulating layer 10. The wiring layer 12 has the plurality of wirings 13. Of these layers, the wiring layer 12 includes wiring connection sections 16, respectively located at the connection structure regions 3 and capable of being electrically connected with the piezoelectric elements 44 via the conductive adhesive (e.g., silver paste). Each wiring connection section 16 is formed of the same material as the material for forming each wiring 13. In this case, two wirings of the plurality of wirings 13 respectively extend from the external equipment connection terminals 6 up to the connection structure regions 3, such that the two wirings 13 can be electrically connected with the piezoelectric elements 44, respectively, via the wiring connection sections 16.

In the substrate main body 2, the wiring layer 12 includes an alignment section 14 located near the connection structure regions 3 and isolated from each wiring 13. This alignment section 14 is also formed of the same material as the material of each wiring 13.

Although not shown, a seed layer formed from nickel (Ni), chromium (Cr) and copper (Cu) and having an approximately 300 μm thickness is provided between the insulating layer 10 and the wiring layer 12. With the provision of this seed layer, the adhesion between the insulating layer 10 and the wiring layer 12 can be enhanced.

In each connection structure region 3, as shown in FIG. 2, the outer periphery 11a of the metallic support layer 11 is located outside relative to the outer periphery 10a of the insulating layer 10 and the outer periphery 16a of the wiring connection section 16 of the wiring layer 12. Namely, in each connection structure region 3, the insulating layer 10, metallic support layer 11 and wiring layer 12 are respectively formed into a substantially circular shape and concentric relative to one another, with the outer diameter of the metallic support layer 11 being larger than the outer diameter of the insulating layer 10 and the outer diameter of the wiring layer 12.

Further, a metallic-support-layer injection hole 32 is provided to extend through the metallic support layer 11 in each connection structure region 3. Namely, the metallic support layer 11 located in each connection structure region 3 is formed into a ring-like shape. In addition, an insulating-layer injection hole 33 is provided to extend through the insulating layer 10, in a position corresponding to the metallic-support-layer injection hole 32. With this configuration, the wiring connection section 16 of the wiring layer 12 is exposed, in each connection structure region 3, to the side of the metallic support layer 11.

In order to form a plated layer 15, a nickel (Ni) plating and gold (Au) plating are provided, successively, to the exposed portion of each wiring connection section 16 of the wiring layer 12 in the insulating-layer injection hole 33. With the provision of this plated layer 15, corrosion in the exposed portion of each wiring connection section 16 of the wiring layer 12 can be positively prevented. Preferably, the thickness of the plated layer 15 is within a range of from 0.1 μm to 4.0 μm.

Further, as shown in FIG. 2, the protective layer 20 for covering the wiring layer 12 is provided on the insulating layer 10. In this case, the outer periphery 20a of the protective layer 20 in each connection structure region 3 is located inside relative to the outer periphery 11a of the metallic support layer 11. Namely, the protective layer 20 located in each connection structure region 3 is formed into the substantially circular shape and is concentric relative to the metallic support layer 11, with the outer diameter of this protective layer 20 being smaller than the outer diameter of the metallic support layer 11. It is noted that this protective layer 20 is omitted, for clarity, in FIG. 1.

Figure 3:
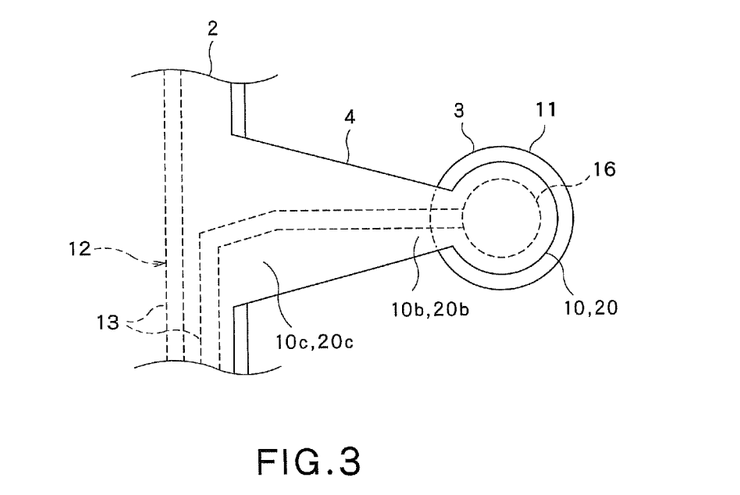
FIG. 3 is a plan view showing one extension structure region in the suspension substrate related to the first embodiment of the present invention.

As shown in FIG. 3, the insulating layer 10 in each extension structure region 4 includes a first insulating layer end portion 10b located on the side of the connection structure region 3, and a second insulating layer end portion 10c located on the side of the substrate main body region 2 and having a width greater (wider) than the width of the first insulating layer end portion 10b. In this embodiment, the insulating layer 10 in each extension structure region 4 has a width gradually increased (widened) from the first insulating layer end portion 10b toward the second insulating layer end portion 10c. Meanwhile, in each extension structure region 4, the metallic support layer 11 is not provided. Namely, the metallic support layer 11 is separated, via each extension structure region 4, into one portion thereof provided in the substrate main body region 2 and the other portion thereof provided in each connection structure region 3.

Similar to the insulating layer 10, the protective layer 20 in each extension structure region 4 includes a first protective layer end portion 20b located on the side of the connection structure region 3, and a second protective layer end portion 20c located on the side of the substrate main body region 2 and having a width greater than the width of the first protective layer end portion 20b. In this embodiment, the protective layer 20 extending in each extension structure region 4 has a width gradually increased from the first protective layer portion 20b toward the second protective layer end portion 20c, corresponding to the insulating layer 10.

As shown in FIG. 1, in the substrate main body region 2, two jig holes 25 are provided to extend through the metallic support layer 11 and insulating layer 10. In this case, the two jig holes 25 are respectively used for alignment for the load beam 43 that will be described later.

Further, in the substrate main body region 2, an alignment through hole 30 is provided in the vicinity of each connection structure region 3. This alignment through hole 30 is used for alignment for each piezoelectric element 44. As shown in FIG. 2, the alignment hole 30 extends through the metallic support layer 11, insulating layer 10 and alignment section 14 of the wiring layer 12, and the protective layer 20, in the substrate main body region 2.

As shown in FIG. 1, the alignment through hole 30 is located on a central axis (X) of the load beam 43, i.e., a straight line connecting the two jig holes 25. Preferably, the alignment through hole 30 is located in the vicinity of each connection structure region 3 that will be connected with the piezoelectric element 44. With this configuration, the accuracy of the alignment between the suspension substrate 1 and each piezoelectric element 44 can be securely enhanced.

Next, each component will be described in more detail.

As the material used for forming the insulating layer 10, any suitable material can be used, without limitation, provided that this material can exhibit desired insulating properties. Preferably, a polyimide (PI) material is used. It is noted that the material for the insulating layer 10 may be a photosensitive material or otherwise may be a non-photosensitive material. Preferably, the thickness of the insulating layer 10 is within a range of from 5 μm to 30 μm, more preferably 8 μm to 10 μm. With this thickness of the insulating layer 10, desired insulating ability between the metallic support layer 11 and each wiring 13 can be ensured. Further, this thickness of the insulating layer 10 can prevent the rigidity of the entire suspension substrate 1 from being unduly lowered.

Each wiring 13 is provided as a conductive body or element adapted for transmitting the electric signal. As the material used for forming each wiring 13, any suitable material can be used, without limitation, provided that this material can exhibit desired conductivity. For instance, a copper (Cu) material is suitable. However, any other material than the copper material can be used, provided that this material can exhibit the electric properties equivalent to those of pure copper. Preferably, the thickness of each wiring 13 is within a range of from 1 μm to 18 μm, more preferably 9 μm to 12 μm. This configuration can ensure adequate transmission characteristics of each wiring 13, as well as can prevent the flexibility of the entire suspension substrate 1 from being unduly lowered. It is noted that the alignment section 14 and each wiring connection section 16 are respectively formed of the same material as the material of each wiring 13, and have the same thickness as the thickness of each wiring 13.

As the material used for forming the metallic support layer 11, any suitable material can be used, without limitation, provided that this material can exhibit proper conductivity, elasticity and strength. For instance, stainless steel, aluminum, beryllium copper and other suitable copper alloys can be used. Preferably, stainless steel is used. Preferably, the thickness of the metallic support layer 11 is within a range of from 10 μm to 30 μm, more preferably 15 μm to 20 μm. With this configuration, the conductivity, rigidity and elasticity of the metallic support layer 11 can be well ensured.

As the material used for the protective layer 20, a proper resin material, e.g., polyimide, can be used. It is noted that the material of this protective layer 20 may be either of the photosensitive material or non-photosensitive material.

Now, referring to FIGS. 4 through 7, the suspension 41 related to this embodiment will be described. The suspension 41 shown in FIG. 4 includes the aforementioned suspension substrate 1, base plate 42, load beam 43 attached to the base plate 42 and adapted for supporting the metallic support layer 11 of the suspension substrate 1, and the pair of piezoelectric elements 44 respectively joined to at least one of the base plate 42 and load beam 43 and connected with the connection structure regions 3 of the suspension substrate 1. In this embodiment, each piezoelectric element 44 is joined to both of the base plate 42 and load beam 43. The base plate 42 and load beam 43 are respectively formed of stainless steel. Further, as shown in FIG. 6, the base plate 42 and load beam 43 respectively have a pair of recesses 42a, 43a and flexible portions 42b, 43b, respectively located between the pair of recesses 42a, 43a.

Figure 5:
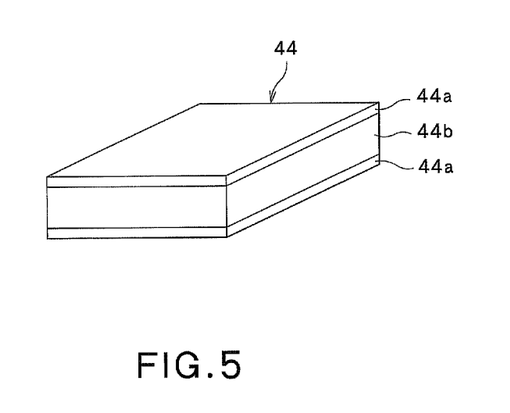
FIG. 5 is a perspective view showing one example of the piezoelectric element provided in the suspension related to the first embodiment of the present invention.

Each piezoelectric element 44 is configured to be expanded and contracted when a proper voltage is applied thereto. More specifically, as shown in FIG. 5, each piezoelectric element 44 includes a pair of electrodes 44a respectively located to be opposed relative to each other, and a piezoelectric material part 44b located between the pair of electrodes 44a and composed of a piezoelectric ceramics, such as the PZT (lead titanate zirconate) or the like. In this case, the piezoelectric material parts 44b of the pair of piezoelectric elements 44 are provided to be respectively polarized, in different directions, by 180°, relative to each other. Therefore, when a predetermined voltage is applied, one piezoelectric element 44 is contracted, while the other piezoelectric element 44 is expanded.

Such piezoelectric elements 44 are respectively stored in the pair of recesses 42a of the base plate 42 and joined to the base plate 42 and load beam 43, with a non-conductive adhesive, such that these elements 44 can be arranged to be symmetrical about the central axis (X) of the load beam 43.

Figure 6:
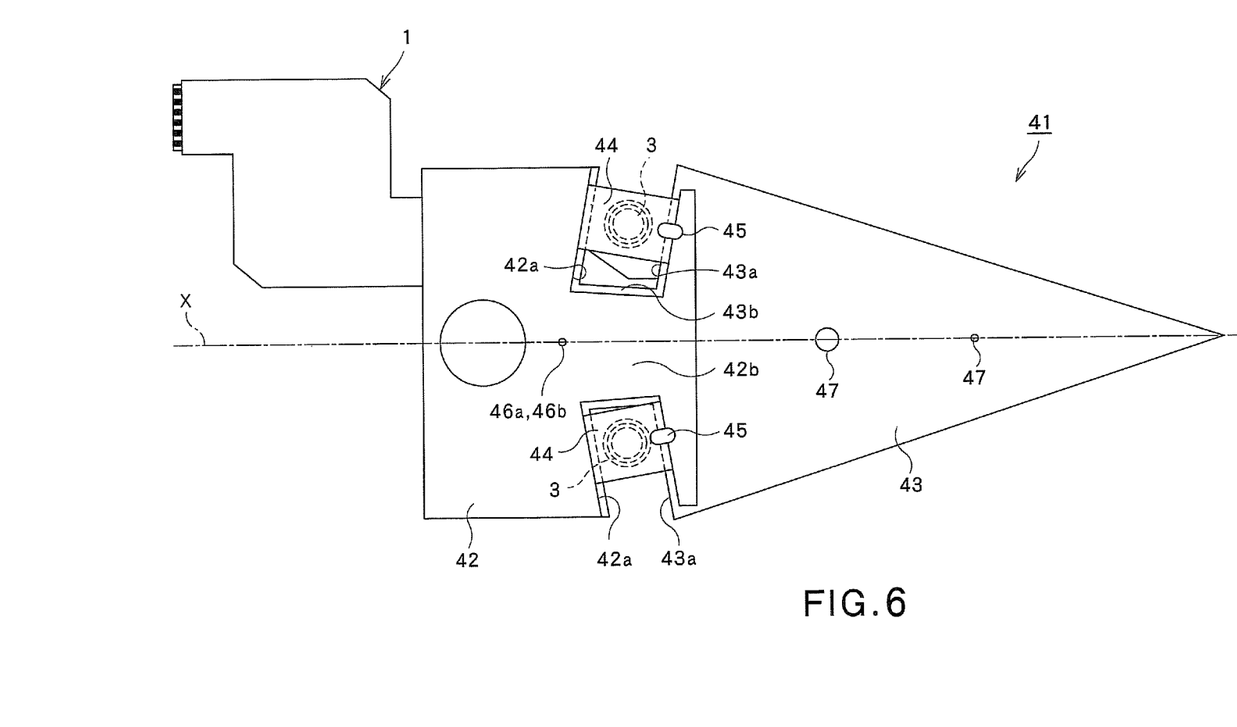
FIG. 6 is a back view showing one example of the suspension related to the first embodiment of the present invention.

More specifically, as shown in FIG. 6, one electrode 44a (i.e., the electrode located on the opposite side relative to the suspension substrate 1) of each piezoelectric element 44 is electrically connected with the base plate 42, via a conductive adhesion section 45 formed of the conductive adhesive.

Figure 7:
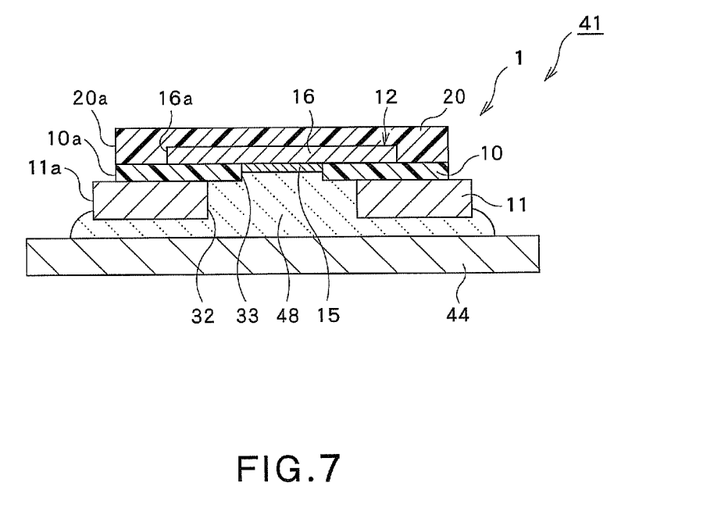
FIG. 7 is a cross section provided for illustrating the connection structure region in the suspension related to the first embodiment of the present invention.

Meanwhile, the other electrode 44a (i.e., the electrode located on the side of the suspension substrate 1) of each piezoelectric element 44 is joined and electrically connected to the connection structure region 3, via the conductive adhesive. Namely, as shown in FIG. 7, a second conductive adhesion section 48 formed of the conductive adhesive is provided in both of the insulating-layer injection hole 33 and metallic-support-layer injection hole 32 in each connection structure region 3. In this case, each piezoelectric element 44 is joined to the connection structure region 3 via the second conductive adhesion section 48, with one electrode 44a of this piezoelectric element 44 being electrically connected with the wiring connection section 16 of the wiring layer 12, via the second conductive section 48. Further, as shown in FIG. 7, the second conductive adhesion section 48 is also provided in a small gap extending between the metallic support layer 11 and each piezoelectric element 44.

As shown in FIG. 6, inspection holes 46a, 46b are provided to extend through the base plate 42 and load beam 43, respectively. Such inspection holes 46a, 46b respectively serve to allow at least a part of the periphery of the alignment through hole 30 to be exposed. Namely, one inspection hole 46a is formed, as a base inspection hole, in the base plate 42, while the other inspection hole 46b is formed, as a beam inspection hole, in the load beam 43. With the provision of such inspection holes 46a, 46b, the alignment through hole 30 can be seen or read from the side of the protective layer 20 as well as from the side of the base plate 42.

Further, beam jig holes 47 are provided in the load beam 43, respectively corresponding to the jig holes 25 of the suspension substrate 1. Such beam jig holes 47 can be respectively used for aligning the suspension substrate 1 and load beam 43, when the load beam 43 is mounted on the metallic support layer 11 of the substrate main body region 2 of the suspension substrate 1.

Now, referring to FIG. 8, the head suspension 51 related to this embodiment will be described. As shown in FIG. 8, the head suspension 51 includes the aforementioned suspension 41 and slider 52 connected with the head terminal 5 of the suspension substrate 1.

Figure 9:
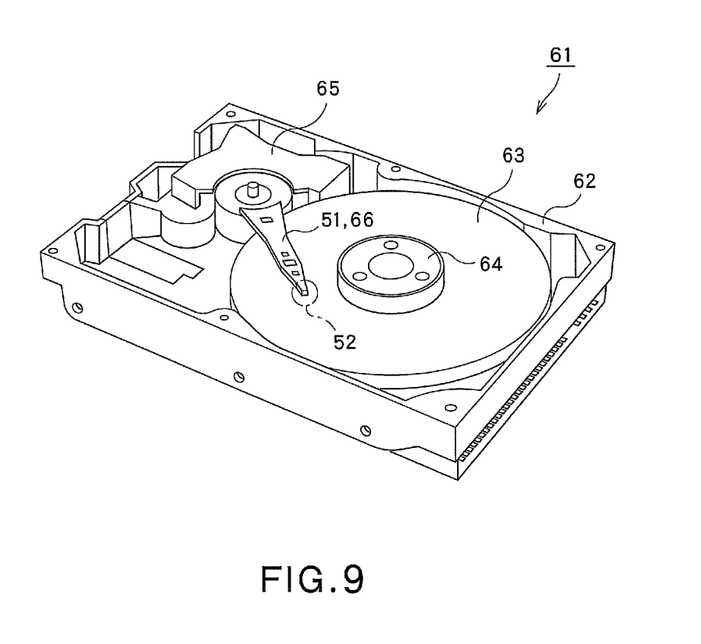
FIG. 9 is a perspective view showing the hard disk drive related to the first embodiment of the present invention.

Next, referring to FIG. 9, the hard disk drive 61 related to this embodiment will be described. As shown in FIG. 9, the hard disk drive 61 includes a case 62, the disk 63 rotatably attached to the case 62 and adapted for storing therein the data, a spindle motor 64 adapted for rotating the disk 63, and the head suspension 51 including the slider 52 adapted for writing and reading the data relative to the disk 63. In this case, the head suspension 51 is provided to be moved near the disk 63, while keeping a desired flying height relative to the disk 63. Specifically, the head suspension 51 is movably attached to the case 62, such that the voice coil motor 65 attached to the case 62 can move the slider 52 of the head suspension 51 along the disk 63. Further, in this case, the head suspension 51 is attached to the voice coil motor 65, via an arm 66.

Next, one exemplary method for manufacturing the suspension substrate 1 related to the embodiment, will be discussed. In this case, one subtractive method for manufacturing the suspension substrate 1 (especially, each connection structure region 3) will be described, by way of example.

First of all, a layered body or material 35 including the insulating layer 10 and metallic support layer 11 provided on one side of the insulating layer 10 and the wiring layer 12 provided on the other side of the insulating layer 10 is prepared (see FIG. 10(a)).

In this case, the metallic layer 11 is first prepared, and then the insulating layer 10 is formed on the metallic layer 11 by a coating method using non-photosensitive polyimide. Subsequently, nickel, chromium and copper are coated, by spattering, successively, on the insulating layer 10, in order to form the seed layer (not shown) thereon. Thereafter, by using the so-formed seed layer as an electrically conductive medium, the wiring layer 12 is formed by a copper plating. In this way, the layered body 35 including the insulating layer 10, metallic support layer 11 and wiring layer 12 can be obtained.

Then, the plurality of wirings 13 and wiring connection section 16 are respectively formed in the wiring layer 12, and the metallic-support-layer injection hole 32 is formed to extend through the metallic support layer 11 (see FIG. 10(b)). In this case, a pattern-like resist (not shown) is first formed on the top face of the wiring layer 12 as well as on the bottom face of the metallic support layer 11, by a photo-fabrication method using a dry film. More specifically, the pattern-like resist is formed, such that the plurality of wirings 13 and wiring connection section 16 can be respectively formed in the wiring layer 12, and such that the metallic-support-layer injection hole 32 can be formed in the metallic support layer 11. Subsequently, each part exposed from the resist formed on both of the wiring layer 12 and metallic support layer 11 is etched. As the method for etching the wiring layer 12 and metallic support layer 11, any suitable method can be employed, without limitation. Preferably, a wet etching method is used. In particular, it is preferred to properly select an etching liquid, depending on the kind of the material used for forming the metallic support layer 11. For instance, in the case of etching the metallic support layer 11 formed of stainless steel, an iron-chloride-based etching liquid, such as an aqueous ferric chloride solution or the like, can be used. After this etching process is ended, the resist is removed.

Thereafter, on the insulating layer 10, the protective layer 20 for covering each wiring 13 of the wiring layer 12 and wiring connection section 16 is provided (see FIG. 10(c)). In this case, the non-photosensitive polyimide is first coated on the insulating layer 10, by using a die coater. Subsequently, the protective layer 20 is formed by drying up the coated non-photosensitive polyimide. Then, on the so-formed protective layer 20, another pattern-like resist (not shown) is formed into a desired shape. Subsequently, the resultant protective layer 20 is developed and etched, and then the so-etched protective layer 20 is cured or hardened, thereby obtaining the protective layer 20 having the desired shape. Once this process is ended, the resist is removed.

Thereafter, the insulating-layer injection hole 33 is formed to extend through the insulating layer 10, and the outer shape of this insulating layer 10 is processed into a desired shape (see FIG. 10(d)). In this case, a still another pattern-like resist is first formed on the insulating layer 10, and then each part of the insulating layer 10 exposed from the resist is etched, thereby forming the insulating-layer injection hole 33 in the insulating layer 10 as well as processing the outer shape of the insulating layer 10. As the method for etching the insulating layer 10, any suitable method can be employed, without limitation. Preferably, the wet etching method is used. In particular, it is preferred to properly select the etching liquid, depending on the kind of the material used for forming the insulating layer 10. For instance, in the case of etching the insulating layer 10 formed of a polyimide resin, an alkaline etching liquid, such as an organic alkaline etching liquid or the like, can be used. After this etching process is ended, the resist is removed.

Thereafter, the gold plating is provided to the portion of the wiring connection section 16 of the wiring layer 12 exposed in the insulating-layer injection hole 33 (see FIG. 10(e)). More specifically, the exposed portion of the wiring connection section 16 is first washed with an acid, and then the nickel plating and gold plating are provided successively to this portion, by an electrolytic plating method. Thus, the plated layer 15 having the thickness of 0.1 μm to 4.0 μm can be obtained. In this case, the head terminal 5 that will be connected with the slider 52 and the external-equipment connection terminal 6 are also plated in the same manner. As the plating method used in this case, a jig plating method may be employed, in place of the electrolytic plating method. Further, the sort of the metal plating used in this case is not limited to the nickel plating and gold plating. For instance, a silver (Ag) plating and/or copper (Cu) plating may be employed.

Thereafter, the outer shape of the metallic support layer 11 is processed (see FIG. 10(f)). In this case, a proper pattern-like resist (not shown) is first formed on the bottom face of the metallic support layer 11, by the photo-fabrication method using the dry film. Then, each part of the metallic support layer 11 exposed from the resist is etched with the iron-chloride-based etching liquid, in order to process the outer shape of the metallic support layer 11. In this etching process, a part of the metallic support layer 11 corresponding to each extension structure region 4 can be removed by the etching. Thereafter, the resist is removed.

In this way, the suspension substrate 1 can be obtained.

Now, one method for manufacturing the suspension related to this embodiment will be described.

First of all, the base plate 42 and load beam 43 are respectively prepared, while the suspension substrate 1 is prepared, in such a manner as described above.

Figure 4:
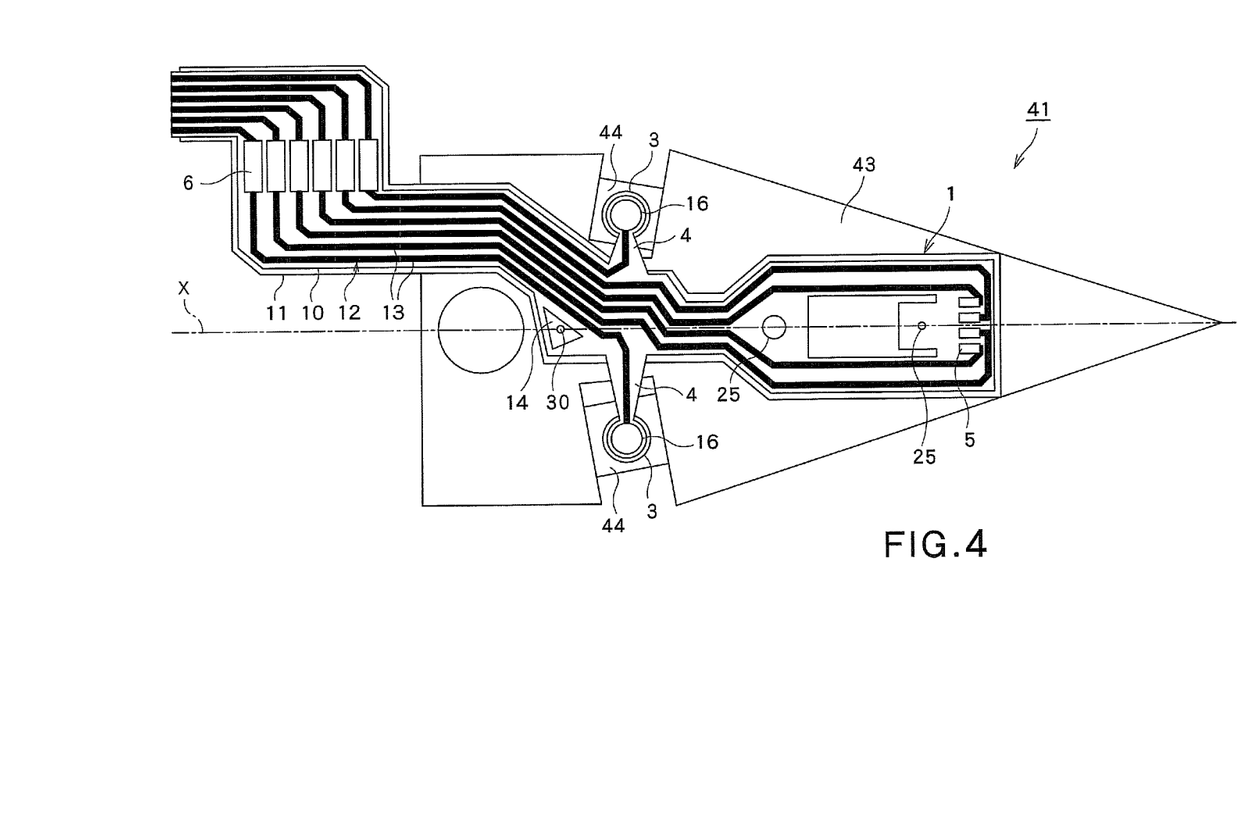
FIG. 4 is a plan view showing one example of the suspension related to the first embodiment of the present invention.

Thereafter, as shown in FIG. 4, the suspension substrate 1 is attached, by welding, to the base plate 42, via the load beam 43. In this case, the load beam 43 is first fixed in position, by welding, to the base plate 42, and then the suspension substrate 1 is aligned with the load beam 43, by utilizing the jig holes 25 respectively provided in the suspension substrate 1 and the beam jig holes 47 respectively provided in the load beam 43. Thereafter, the suspension substrate 1 is joined and fixed, by welding, to the load beam 43.

Then, each piezoelectric element 44 is aligned with the suspension substrate 1, by using the alignment through hole 30 provided in the suspension substrate 1. In this case, the base plate 42, load beam 43 and suspension substrate 1 are first set in a mounting unit (not shown) for mounting the piezoelectric elements 44, while such members 42, 43 and substrate 1 are fixed in position relative to each other. Subsequently, in this mounting unit, the alignment through hole 30 of the suspension substrate 1 is read by a reading mechanism (not shown), such as a CCD camera or the like, provided for reading the alignment through hole 30. Then, by using the so-read alignment through hole 30, as a reference, each piezoelectric element 44 is positioned relative to the base plate 42 and load beam 43 in the mounting unit. In this way, each piezoelectric element 44 can be aligned, accurately, relative to the suspension substrate 1. In this case, each piezoelectric element 44 is stored in each corresponding recess 42a of the base plate 42.

Thereafter, each aligned piezoelectric element 44 is joined to the base plate 42 and load beam 43, by using a proper adhesive, and is connected with the connection structure region 3 of the suspension substrate 1. In this case, each piezoelectric element 44 is joined to the base plate 42 and load beam 43, by using the non-conductive adhesive, and one electrode 44a (i.e., the electrode located on the opposite side relative to the suspension substrate 1) of this piezoelectric element 44 is electrically connected with the base plate 42, via the conductive adhesion section 45 formed of the conductive adhesive.

Meanwhile, the other electrode 44a (i.e., the electrode located on the side of the suspension substrate 1) of each piezoelectric element 44 is joined and electrically connected relative to the connection structure region 3 of the suspension substrate 1, by using the conductive adhesive. In this case, the conductive adhesive is injected, via the gap provided between the metallic support layer 11 and the each piezoelectric element 44, into the insulating-layer injection hole 33 and metallic-support-layer injection hole 32, thereby forming the second conductive adhesion section 48. In this way, each piezoelectric element 44 can be joined to the connection structure region 3 of the suspension substrate 1, as well as one electrode 44a of this piezoelectric element 44 can be electrically connected with the wiring connection section 16 of the wiring layer 12. In this process, the gap provided between the metallic support layer 11 and each piezoelectric element 44 is also filled with the conductive adhesive (see FIG. 7).

During the above operation, as shown in FIGS. 2 and 7, since the outer periphery 11a of the metallic support layer 11 in each connection structure region 3 is positioned outside relative to the outer periphery 10a of the insulating layer 10, the outer periphery 16a of the wiring connection section 16 of the wiring layer 12 and the outer periphery 20a of the protective layer 20, such an outer periphery 11a of the metallic support layer 11 can be visually confirmed. Thus, a worker or the like can perform the injection of the conductive adhesive, while watching overflow the conductive adhesive from the metallic support layer 11. This visual confirmation can successfully prevent the conductive adhesive from being unduly overflowed from the metallic support layer 11 and hence reaching any other metallic structure (e.g., the load beam 43 or the like) located around each connection structure region 3 (see FIG. 8).

In this way, the suspension 41 including the piezoelectric elements 44, respectively connected with the connection structure regions 33 of the suspension substrate 1, can be obtained.

Further, the head suspension 51 as shown in FIG. 8 can be obtained by connecting the slider 52 with the head terminal 5 of the suspension 41. Furthermore, the hard disk drive 61 as shown in FIG. 9 can be obtained by attaching the head suspension 51 to the case 62 of the hard disk drive 61.

Upon writing and reading operations for the data performed in the hard disk drive 61 shown in FIG. 9, the slider 52 of the head suspension 51 is moved along the disk 63 by the voice coil motor 65, with the desired flying height being kept between the slider 52 and the disk 63 rotated by the spindle motor 64. With this operation, the data is transferred between the slider 52 and the disk 63. During this operation, the electric signal is transmitted through each wiring 13 extending between the head terminal 5 of the suspension substrate 1 and the external equipment connection terminal 6.

Upon moving the slider 52, the voice coil motor 65 serves to roughly control the position of the slider 52, and each piezoelectric element 44 serves to finely control the position of the slider 52. Namely, when the predetermined voltage is applied to each electrode 44a of the piezoelectric elements 44 located on the side of each corresponding connection structure region 3 of the suspension substrate 1, one piezoelectric element 44 will be contracted in the axial direction of the load beam 43, while the other piezoelectric element 44 will be expanded in the same direction. In this case, both of the flexible portion 42b of the base plate 42 and the flexible portion 43b of the load beam 43 are elastically transformed, as such the slider 52 located on the distal end side of the load beam 43 can be moved in a sway direction (or pivot direction). In this way, the slider 52 can be aligned rapidly and accurately with a desired track of the disk 63.

As stated above, according to this embodiment, the outer periphery 11a of the metallic support layer 11 can be visually confirmed, when each piezoelectric element 44 is connected, via the conductive adhesive, with each corresponding connection structure region 3 of the suspension substrate 1. This visual confirmation can prevent the conductive adhesive from being unduly overflowed from the metallic support layer 11 and thus reaching any other metallic structure (e.g., the load beam 43 or the like) located around each connection structure region 3. Therefore, the short circuit between the electrodes 44a of each piezoelectric element 44 that may be otherwise caused by such overflow of the conductive adhesive can be securely prevented.

Further, in each extension structure region 4 according to this embodiment, the width of each second insulating layer end portion 10c of the insulating layer 10 is set wider than the width of each first insulating layer end portion 10b, as well as the width of the second protective layer end portion 20c of the protective layer 20 is set wider than the width of the first protective layer end portion 20b. With this configuration, the visual confirmation ability relative to the outer periphery 11a of the metallic support layer 11 can be ensured, as well as the mechanical strength of each extension structure region 4 can be enhanced.

In this embodiment, one example has been shown and described, in which the insulating layer 10 extending in each extension structure region 4 of the suspension substrate 1 is gradually widened from the first insulating layer end portion 10b toward the second insulating layer end portion 10c, and in which the protective layer 20 extending in the extension structure region 4 is gradually widened from the first protective layer end portion 20b toward the second protective layer end portion 20c. However, the configuration of such layers is not limited to this example. For instance, the protective layer 20 may be formed into any other suitable shape, provided that this shape can adequately enhance the mechanical strength of each extension structure region 4. Further, either of the insulating layer 10 and protective layer 20 may be formed into any other suitable shape.

Further, in this embodiment, one example has been described, in which the piezoelectric elements 44 are respectively arranged on both sides of the substrate main body region 2 of the suspension substrate 1, and in which the pair of connection structure regions 3 that will be connected with the piezoelectric elements 44 are respectively connected with the substrate main body region 2. However, the arrangement of such elements 44 and regions 3 is not limited to this aspect. For instance, the present invention can also be applied to the case in which only one connection structure region 3 that can be connected with the piezoelectric elements 44 is connected with the substrate main body region 2 of the suspension substrate 1.

Further, in this embodiment, one example, in which the suspension substrate 1 is manufactured by employing the subtractive method, has been shown and described. However, the suspension substrate 1 may be manufactured by the so-called additive method.

In addition, in this embodiment, one example, in which the pair of piezoelectric elements 44 are respectively joined to the base plate 42 and load beam 43, has been shown and described. However, the joining manner of the piezoelectric elements 44 is not limited to this example. For instance, the pair of piezoelectric elements 44 may be respectively joined only to the base plate 42 or only to the load beam 43, in any suitable positions of the base plate 42 or load beam 43. Further, a slider holding plate (not shown) for holding the slider 52 may be provided at a distal end of the load beam 43, such that the pair of piezoelectric elements 44 can be respectively joined to a region between the load beam 43 and the slider holding plate.

Second Embodiment

Now, referring to FIG. 11, the suspension substrate, suspension, head suspension and hard disk drive, respectively related to the second embodiment of the present invention, will be described.

Figure 10:
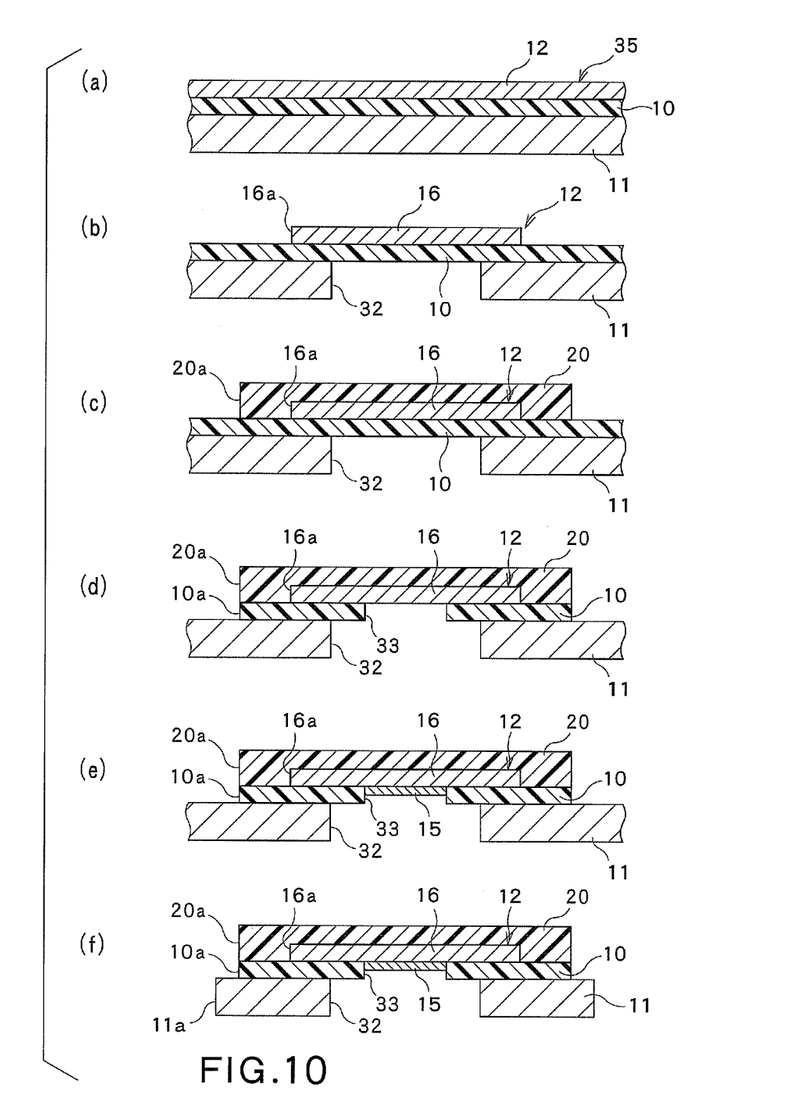
FIGS. 10(a) through 10(f) are provided for respectively illustrating one method for manufacturing the suspension substrate related to the first embodiment of the present invention.
Figure 11:
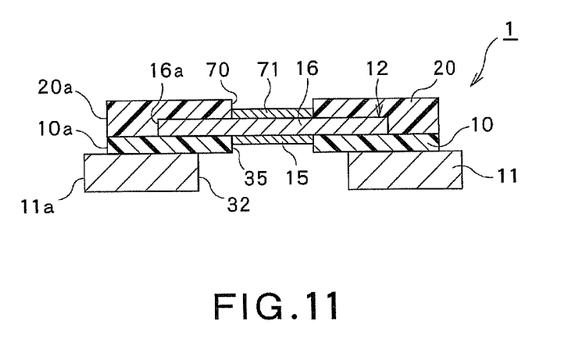
FIG. 11 is a cross section provided for illustrating the connection structure region in the suspension substrate related to a second embodiment of the present invention.

A key point of this second embodiment shown in FIG. 11 is that a through hole for exposing the wiring connection section of the wiring layer is provided to extend through the protective layer, wherein the gold plating is provided to the exposed portion of the wiring connection section in the though hole. Namely, except for this key point, the other construction of the second embodiment is substantially the same as the first embodiment shown in FIGS. 1 through 10. It is noted that like parts in the first embodiment shown in FIGS. 1 through 10 are respectively designated by like reference numerals in FIG. 11, and further explanation on such parts will be omitted below.

Namely, in each connection structure region 3 of the suspension substrate 1, as shown in FIG. 11, an inspection through hole 70 for exposing the wiring connection section 16 of the wiring layer 12 is provided to extend through the protective layer 20. Further, in this inspection through hole 70, the nickel plating and gold plating are provided, successively, to the exposed portion of the wiring connection section 16, thereby forming a second plated layer 71. As such, unwanted corrosion of the exposed portion of the wiring connection section 16 of the wiring layer 12 can be well prevented. It is noted that the second plated layer 71 can be formed in the same manner as in the case of forming the plated layer 15 described in the first embodiment (see FIG. 2).

According to this embodiment, the outer periphery 11a of the metallic support layer 11 can be visually confirmed, when the piezoelectric elements 44 are respectively connected with the connection structure regions 3 of the suspension substrate 1, via the conductive adhesive. This visual confirmation can successfully prevent the conductive adhesive from being unduly overflowed from the metallic support layer 11 and hence reaching any other metallic structure (e.g., the load beam 43 or the like) located around each connection structure region 3. Therefore, the short circuit between the electrodes 44a of each piezoelectric element 44 that may be otherwise caused by such overflow of the conductive adhesive can be securely prevented.

Further, according to this embodiment, the wiring connection section 16 of the wiring layer 12 is exposed in the inspection through hole 70 extending through the protective layer 20, and the gold plating is provided to the exposed portion of the wiring connection section 16. With this configuration, a continuity test for testing electrical continuity between the wiring connection section 16 and each piezoelectric element 44 can be performed from a top face of the wiring connection section 16, by using inspection equipment, such as a probe or the like. Further, in this case, the gold plating provided to the exposed portion of the wiring connection section 16 can serve to effectively prevent undesired deformation of the top face of the wiring connection section 16, even when a sharp distal end point of the inspection equipment is pressed against the top face of the wiring connection section 16.

While several preferred embodiments of the present invention have been described and shown in detail, each of the suspension substrate, suspension, head suspension and hard disk drive, respectively related to this invention, is not limited, in any way, to such embodiments. Namely, various modifications and variations can be made to such embodiments, without departing from the scope and gist of this invention.

The invention claimed is:

1. A suspension substrate including a substrate main body region, a connection structure region configured to be connected with an actuator element via a conductive adhesive, and an extension structure region extending between the substrate main body region and the connection structure region, the suspension substrate comprising:
   an insulating layer;
   a metallic support layer provided on the actuator element's side of the insulating layer; and
   a wiring layer provided on the other side of the insulating layer, the wiring layer including a plurality of wirings and a wiring connection section configured to be electrically connected with the actuator element, via the conductive adhesive,
   wherein, an opening for injecting the conductive adhesive is provided in the metallic support layer and the insulating layer, and wherein in the connection structure region the outer periphery of the insulating layer and the outer periphery of the wiring connection section of the wiring layer, in plan view, are positioned between the outer periphery and the inner periphery of the metallic support layer.

2. The suspension substrate according to claim 1, further comprising a protective layer for covering the wiring layer,
   wherein the outer periphery of the protective layer in the connection structure region is positioned inside relative to the outer periphery of the metallic support layer.

3. The suspension substrate according to claim 2,
   wherein a through hole for exposing the wiring connection section of the wiring layer is provided to extend through the protective layer in the connection structure region, and
   wherein gold plating is provided to the exposed portion of the wiring connection section in the through hole.

4. The suspension substrate according to claim 1, wherein the insulating layer in the extension structure region includes a first insulating layer end portion located on the side of the connection structure region, and a second insulating layer end portion located on the side of the substrate main body region and having a width greater than the width of the first insulating layer end portion.

5. The suspension substrate according to claim 4, wherein the insulating layer in the extension structure region has a width gradually increased from the first insulating layer end portion toward the second insulating layer end portion.

6. The suspension substrate according to claim 4, further comprising a protective layer for covering the wiring layer,
   wherein the protective layer in the extension structure region includes a first protective layer end portion located on the side of the connection structure region, and a second protective layer end portion located on the side of the substrate main body region and having a width greater than the width of the first protective layer end portion.

7. The suspension substrate according to claim 6,
   wherein the insulating layer in the extension structure region has a width gradually increased from the first insulating layer end portion toward the second insulating layer end portion, and
   wherein the protective layer in the extension structure region has a width gradually increased from the first protective layer end portion toward the second protective layer end portion.

8. The suspension substrate according to claim 6, wherein the outer periphery of the protective layer in the connection structure region is positioned inside relative to the outer periphery of the metallic support layer.

9. The suspension substrate according to claim 6,
   wherein a through hole for exposing the wiring connection section of the wiring layer is provided to extend through the protective layer, in the connection structure region, and
   wherein gold plating is provided to the exposed portion of the wiring connection section in the through hole.

10. A suspension, comprising:
    a base plate;
    the suspension substrate according to claim 1 and attached to the base plate via a load beam; and
    the actuator element joined to at least one of the base plate and load beam, the actuator element being connected with the connection structure region of the suspension substrate, via the conductive adhesive.

11. A head suspension, comprising:
the suspension according to claim 10; and
a slider mounted on the suspension.

12. A hard disk drive comprising the head suspension according to claim 11.

13. The suspension substrate according to claim 1, wherein the opening includes a through hole which is formed to extend through the insulating layer and expose the wiring connection section, and wherein the wiring connection section covers the through hole in the insulating layer.

* * * * *